United States Patent
Tews et al.

(10) Patent No.: US 7,767,562 B2
(45) Date of Patent: Aug. 3, 2010

(54) METHOD OF IMPLANTING USING A SHADOW EFFECT

(75) Inventors: Helmut Horst Tews, Poughkeepsie, NY (US); Jochen Beintner, Wappingers Falls, NY (US)

(73) Assignee: Qimonda AG (DE)

( * ) Notice: Subject to any disclaimer, the term of this patent is extended or adjusted under 35 U.S.C. 154(b) by 95 days.

(21) Appl. No.: 11/235,330

(22) Filed: Sep. 26, 2005

(65) Prior Publication Data

US 2006/0024930 A1 Feb. 2, 2006

Related U.S. Application Data

(62) Division of application No. 09/714,356, filed on Nov. 16, 2000, now Pat. No. 6,967,147.

(51) Int. Cl.
*H01L 21/425* (2006.01)
(52) U.S. Cl. ............. 438/525; 438/531; 438/981; 257/E21.001
(58) Field of Classification Search ............ 438/520, 438/525, 531, 981; 257/E21.001
See application file for complete search history.

(56) References Cited

U.S. PATENT DOCUMENTS

| | | | |
|---|---|---|---|
| 4,454,524 A | 6/1984 | Spence | |
| 5,330,920 A | 7/1994 | Soleimani et al. | |
| 5,426,327 A * | 6/1995 | Murai | 257/408 |
| 5,885,886 A * | 3/1999 | Lee | 438/528 |
| 5,920,779 A | 7/1999 | Sun et al. | |
| 6,030,875 A * | 2/2000 | May et al. | 438/302 |
| 6,037,639 A | 3/2000 | Ahmad | |
| 6,080,682 A | 6/2000 | Ibok | |
| 6,087,214 A | 7/2000 | Cunningham | |
| 6,323,106 B1 | 11/2001 | Huang et al. | |
| 6,413,826 B2 | 7/2002 | Kim | |

FOREIGN PATENT DOCUMENTS

EP 0 884 776 A2 12/1998

\* cited by examiner

*Primary Examiner*—Jack Chen

(57) ABSTRACT

A semiconductor body has a first portion, a second portion, and an active area located between the first portion and the second portion. The first portion and the second portion are a shallow trench isolation region having an exposed surface extending above the surface of the active area. A first ion implantation is performed at a first angle such that a first shaded area defined by the exposed surface of the first portion and the first angle is exposed to fewer ions than a first unshaded area. A second ion implantation is performed at a second angle such that a second shaded area defined by the exposed surface of the second portion and the second angle is exposed to fewer ions than a second unshaded area.

29 Claims, 2 Drawing Sheets

METHOD OF IMPLANTING USING A SHADOW EFFECT

This application is a divisional of patent application Ser. No. 09/714,356, entitled "Nitrogen Implantation Using A Shadow Effect To Control Gate Oxide Thickness In DRAM Semiconductor," filed on Nov. 16, 2000 now U.S. Pat. No. 6,967,147, which application is incorporated herein by reference.

TECHNICAL FIELD

This invention relates generally to a method of making semiconductor devices, and more particularly to an implantation method using a shadow effect.

BACKGROUND

In the arrangement of DRAM cell processing using a shallow trench isolation region to realize a small-size capacitor, gate oxide reliability of support oxides is limited by the thickness of the gate oxide at the AA (active area) corners. Therefore, careful optimization of the AA oxidation, (sacrificial) oxide, and oxidation is necessary to create the required AA corner rounding and the oxide thickness at the AA corner. In fact, in all too many instances, the oxide is thinner at the corners than at the AA area.

U.S. Pat. No. 5,330,920 discloses a method of controlling gate oxide thickness in the fabrication of semiconductor devices. In this process a sacrificial gate oxide layer is formed on select locations of a semiconductor substrate surface. Nitrogen ions are implanted into the select locations of the substrate through the sacrificial gate oxide layer. The substrate and sacrificial gate oxide layer are thermally annealed to assist pile-up of the nitrogen ions at the semiconductor substrate surface. The sacrificial gate oxide layer is removed and a gate oxide layer is thermally formed on the silicon semiconductor substrate surface. The select locations having nitrogen ion implanted will have a thinner gate oxide layer than a non-implanted region.

Fabrication of an integrated device using nitrogen implantation is disclosed in U.S. Pat. No. 6,037,639. In this process, a channel region is defined by a source and drain region of a semiconductor substrate. A gate structure includes an isolating oxide layer positioned on the channel region and a polysilicon layer positioned on the oxide layer. More specifically, the process includes the step of forming the nitrogen implanted regions over the semiconductor substrate by implanting nitrogen atoms into those regions and growing spacers from exposed portions of the polysilicon layer. During the spacer growth, the spacer grows vertically as well as laterally extending under the polysilicon edges. Diffusion of nitrogen atoms to the substrate surface forms silicon nitride under the gate edges, which minimizes current leakages into the gate polysilicon.

U.S. Pat. No. 5,920,779 discloses a process for differential gate oxide thickness by nitrogen implantation for mixed mode and embedded VLSI circuits. A semiconductor substrate has a surface and includes a first region on which a plurality of first MOS devices are to be formed and a second region on which a plurality of second MOS devices are to be formed. The second region is masked and a first concentration of a first dopant is provided in the semiconductor substrate at the surface of the first region without doping the second region. The mask is then removed from over the second region. The first region is masked and a second concentration of a second dopant is provided in the semiconductor substrate at the surface of the second region without doping the first region. The second concentration is different than the first concentration. The surface of the semiconductor substrate is oxidized to grow a first thickness of oxide on the first region of the semiconductor substrate and to grow a second, different thickness of oxide on the second region in a single oxidizing process. First MOS devices are formed on the first regions of the semiconductor substrate incorporating the first thickness of oxide and second MOS devices are formed on the second region incorporating the second thickness of oxide. The first and second dopants are both nitrogen and the first concentration is greater than the second concentration.

In general, a typical way to achieve two oxide thicknesses in one oxidation step is to make use of local nitrogen implantation to reduce the oxidation rate at the implanted sites. The use of local nitrogen implementation to achieve two oxidation thicknesses in one oxidation step consists of utilizing the process integration scheme that includes growing of a sacrificial oxide. Dopants are implanted through the sacrificial oxide. A photoresist mask is employed to pattern an integrated circuit that includes the first transistor having a first dielectric thickness and a second transistor having a second dielectric thickness. Nitrogen ions are implanted to create dual gate oxide devices. The photoresist mask and the sacrificial oxide are stripped off and the gate is subjected to oxidation.

Due to the fact that, in many cases, the gate oxide reliability of support oxide is limited by the thickness of the gate oxide at the AA (active area) corners, and careful optimization of AA oxidation, sacrificial oxide, and gate oxidation is necessary to create the required AA corner rounding and the oxide thickness at the AA corner, there is a need to limit the dual gate nitrogen dose in the AA to the inner part of the gate area to provide increased gate oxide thickness at the active area corner and thereby increase the threshold of the parasitic corner device, reduce sub-threshold voltage ($V_t$) and junction leakage.

SUMMARY OF THE INVENTION

The invention relates to fabrication of integrated circuit devices incorporating different thicknesses of gate oxides by using nitrogen implantation. Either angled nitrogen implantation or nitride spacers are used to create a "shadow effect," which limits the nitrogen dose close to the edges of the active area. This reduction of nitrogen dose leads to an increased gate oxide thickness at the active area adjacent to the shallow trench and increases the threshold of the parasitic corner device and reduces sub-threshold voltage ($V_t$) and junction leakage.

One object of the present invention is to provide a dual gate oxide process for high performance DRAM systems to limit the dual gate nitrogen dose in the AA adjacent the STI oxide by use of a "shadow effect."

Another object of the present invention is to provide a dual gate oxide process for high performance DRAM systems that limit the dual gate nitrogen dose in the AA to the inner part adjacent the STI oxide by use of a "shadow effect" by eliminating the use of vertical nitrogen ion implantation under non-channeling conditions.

A further object of the present invention is to provide a dual gate oxide process for high performance DRAM systems by utilizing either an angled nitrogen ion implantation or nitride deposition to limit the nitrogen dose in the AA to the inner part adjacent the STI oxide by creating a "shadow effect" from the STI oxide which serves to reduce the $N_2$ dose to the AA edge to create an increased gate oxide at the AA corner and thereby increase the threshold of the parasitic corner device, and reduce sub $V_t$ (threshold voltage) and junction leakage.

These and other objects of the invention will become more apparent by reference to the Brief Description Of The Drawings and Detailed Description Of The Preferred Embodiment Of The Invention.

DETAILED DESCRIPTION OF ILLUSTRATIVE EMBODIMENTS

Figure 1:
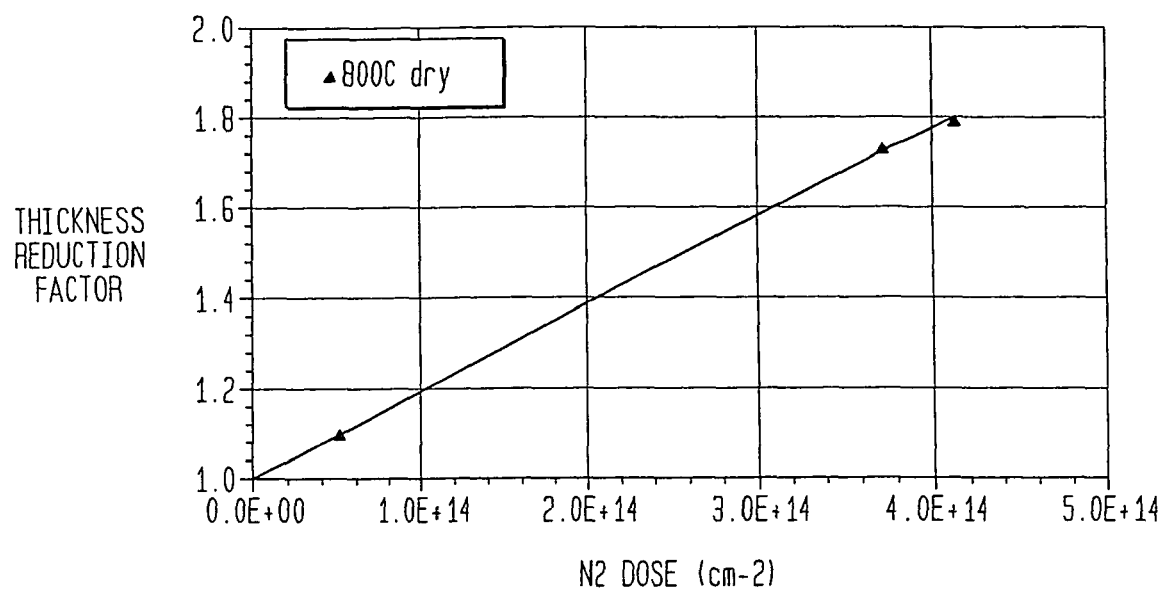
FIG. 1 is a graph comparing thickness reduction factor versus level of nitrogen dosage by implantation for an 800° C. dry oxidation in pure oxidation.

In general, the invention process scheme for providing angled nitrogen implantation into the gate area to create a "shadow effect" during implantation is accomplished by providing an active area (etching, oxidation, fill, planarization, and a pad nitride strip). A sacrificial oxide is grown on the substrate. Masking steps are provided for channel implants. Channel implants are effected. A first angled nitrogen implantation is effected without resist mask to create a "shadow effect" from the STI oxide to reduce the $N_2$ dose at the active area edge and to provide an increased thickness of gate oxide at the active area corners. A masking step is provided for nitrogen ion implantation and a second angled nitrogen implantation is effected to create a "shadow effect" from the STI oxide to reduce the $N_2$ dose at the active area edge to provide increased thickness gate oxide at the active area corners.

In particular, the process flow for fabricating a dynamic random access memory cell utilizing angled nitrogen implantation of the invention entails the following steps. The active area is formed by the well-known process of forming, over a substrate, a patterned hard mask layer that exposes portions of the substrate so as to define an isolation region. Exposed regions of the substrate are etched using the patterned hard mask layer to form an isolation trench in the isolation region. The substrate is oxidized to form a thermal oxide layer in the isolation trench. An oxide layer is deposited over the thermal oxide layer to fill unfilled portions of the isolation trench. The patterned hard mask is removed. The substrate can then be planarized and a pad nitride is stripped.

A sacrificial gate oxide layer is formed in the areas of the semiconductor substrate where the pad nitride has been stripped off. Channel implants are effected in selected areas using resist masks. A first low dose angled nitrogen implant is effected without using an implant mask in a manner to limit the nitrogen dose in the area to the inner part of the gate area so that the angled nitrogen dose in the "shadow part" of the active area is less than the amount of the nitrogen dose implanted in the remaining non-shadowed area (to affect the spatial thickness distribution of all exposed oxide areas). A masking is effected so that nitrogen ions ($N_2$+) to be implanted do not penetrate the masked region. A second angled nitrogen ion implantation is effected in a manner so as to limit the dual gate nitrogen dose in the active area to the inner part of the gate area so that the angled nitrogen dose in the "shadow part" of the active area is less than the amount of the nitrogen dose implanted in the remaining non-shadowed area.

In general, nitrogen ion implantation is known to be done vertically under non-channeling conditions in the prior art. There the goal of the nitrogen ion implantation is to create a thinner oxide in the implanted areas, thereby leading to two oxide thicknesses for the non-implanted area and the nitrogen implanted area.

Reference is now made to FIG. 1, which shows a graph of thickness reduction due to $N_2$ implantation followed by a thermal oxidation in pure oxygen at a temperature of 800° C. The thickness reduction factor is defined as the ratio of the oxide thickness without nitrogen implantation divided by the oxide thickness with nitrogen implantation.

Figure 2:
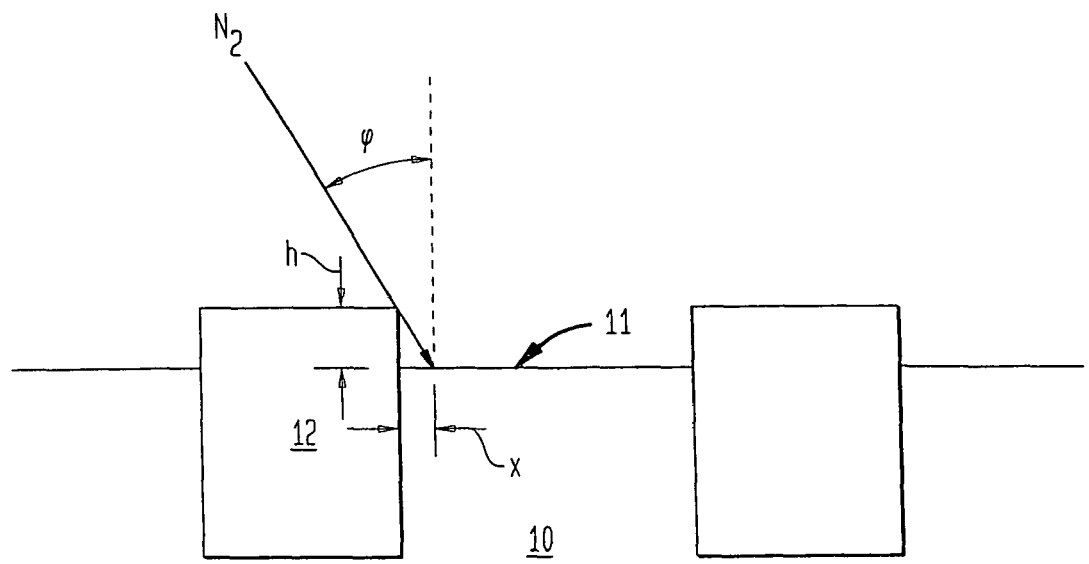
FIG. 2 is a diagram depicting nitrogen implantation at a non-vertical angle φ with respect to the water surface at the normal, in which the AA at the inner part adjacent the STI oxide is under a "shadow effect.

In the context of the invention process, reference is made to the schematic diagram of FIG. 2, which shows nitrogen ions $N_2$ implanted under an angle φ with respect to the normal surface of the active area 10 of the wafer surface 11. Two implantations are conducted under +φ and under −φ. The nitrogen dose in the shadow area of the AA is half the amount of nitrogen ion dose implanted in the remaining, non-shadowed area.

The length of the shadow area x is calculated according to the following formula:

$$\text{Tan } \phi = x/h$$

where h is the height of STI oxide 12 over the active area surface. When h=500 Å (±150 Å) and φ=60 degrees, the maximum value for x=866 Å. If an angle of 15 degrees is chosen, x=130 Å (±40 Å). The shadow length can be chosen over a long range. The goal for x is approximately 10% of the ground rule, e.g., 100 Å-170 Å in the existing microelectronic technologies.

To comprehend the effect of the nitrogen implantation on oxide thickness, thick and thin oxides within the framework of dual gate technology are discussed separately.

First, the thick oxide case will be discussed. In the dual gate process known in the art, the thick oxide is not exposed to a nitrogen implantation. The invention uses a low dose nitrogen implant for the thick oxide to modify and optimize its spatial thickness distribution. The nitrogen dose is chosen to be $5 \times 10^{13}$ to $10^{14}$ cm$^{-2}$. For the case $10^{14}$ cm$^{-2}$ and using 800° C. oxidation, a reduction of the oxide thickness of approximately 20% is achieved in the non-shadow region of the gate. In the shadow regions where only $5 \times 10^{13}$ cm$^{-2}$ is implanted, the oxide thickness is reduced by only 10%.

In the thin oxide example, the nitrogen dose is chosen to be approximately $4 \times 10^{14}$ cm$^{-2}$. This gives a reduction of 70% with respect to the non-implanted case, or 50% in the case of the $10^{14}$ cm$^{-2}$ implanted thick oxide. The oxide at the STI oxide edges is 35% thicker than in the non-shadow region.

Figure 3:
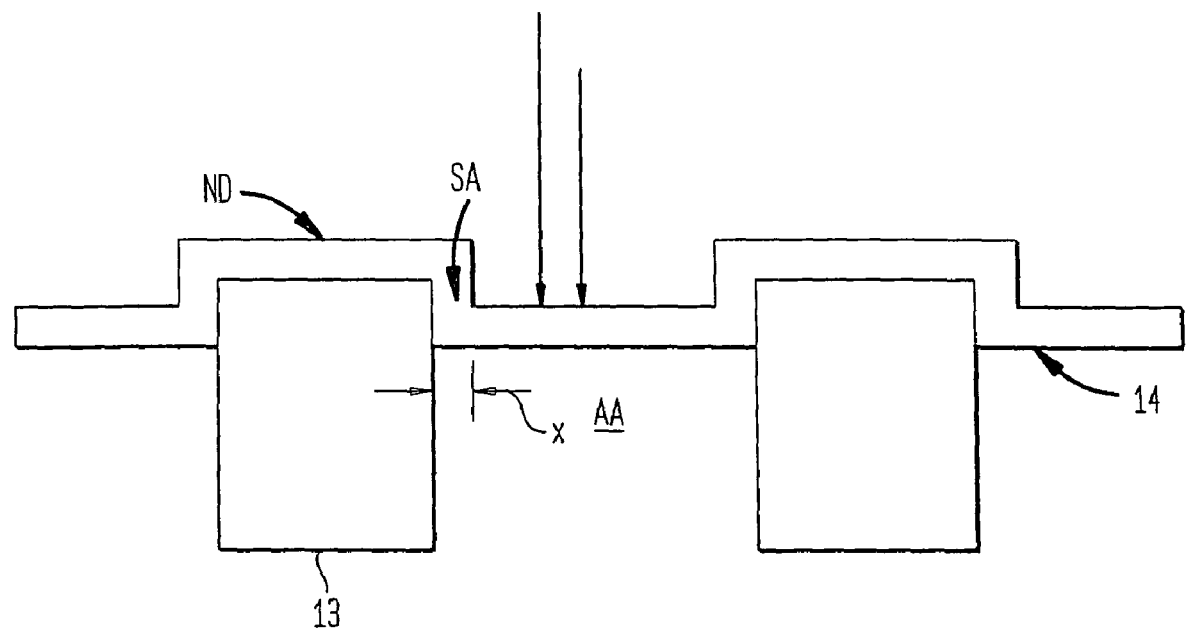
" and FIG. 3 is a depiction of an alternative integration scheme using a nitride spacer deposition to create the "shadow effect" and in which the shadow is complete without the necessity to use angled nitrogen ion implantation to reduce the dual gate nitrogen dose adjacent the STI oxide.

FIG. 3 shows an alternative embodiment of the invention process that provides a "shadow effect" or shadow area SA that is complete or fixed. This embodiment eliminates the need to utilize angled nitrogen ion implantation and yet still achieves benefits as though angled nitrogen implantation had been used.

In this alternative embodiment of the invention process, the integration scheme utilizes a nitride spacer deposition to provide the shadow effect. In this alternative embodiment, a nitride deposition ND, such as that of silicon nitride, is performed after the channel implantation steps. Thereafter, optionally, steam oxidation may be employed to convert the nitride layer into an oxide. Following conversion of the nitride layer into an oxide by steam oxidation, vertical implantation of nitrogen ions, as shown by the two downwardly pointing arrows, is employed. Since the "shadow effect" as shown by x results from the nitride deposition, vertical nitrogen ion implantation still results in less nitrogen ion implantation in the area adjacent the STI oxide 13 as shown by x, than in the active area AA of wafer surface 14.

In this alternative integration scheme of the process of the invention, since the "shadow effect" is complete by virtue of the nitride deposition, it is not necessary to use angled nitrogen ion implantation.

What is claimed is:

1. A method of making a semiconductor device, the method comprising:
    forming an active area disposed in a semiconductor body between a first raised portion and a second raised portion;
    performing a first ion implantation at a first angle in the active area,
    wherein the first ion implantation implants substantially less ions in a first shaded area formed by the first angle and the first raised portion than other areas of the active area;
    performing a second ion implantation at a second angle in the active area, wherein the second ion implantation implants substantially less ions in a second shaded area formed by the second angle and the second raised portion than other areas of the active area; and
    after the first ion implantation and the second ion implantation, forming a gate oxide over the entire active area.

2. The method of claim 1, wherein the first angle is a positive angle with respect to a first axis perpendicular to a plane formed by a surface of the semiconductor body and wherein the second angle is a negative angle with respect to the first axis.

3. The method of claim 1, wherein forming the gate oxide comprises the step of oxidizing the semiconductor body.

4. The method of claim 3, wherein the step of oxidizing is performed by a thermal oxidation process.

5. The method of claim 4, wherein the step of oxidizing is performed in an oxygen environment at a temperature of about 800° C.

6. The method of claim 1, wherein the first ion implantation implants nitrogen ions.

7. The method of claim 6, wherein the second ion implantation implants nitrogen ions.

8. The method of claim 1, wherein the areas implanted by the first ion implantation and the areas implanted by the second ion implantation overlap.

9. The method of claim 8, wherein the overlap region is about equidistant to the first raised portion and the second raised portion.

10. The method of claim 1, wherein providing the semiconductor body comprises providing a substrate having an active area between the first raised portion and the second raised portion.

11. The method of claim 1, wherein the first raised portion and the second raised portion comprise isolation regions.

12. The method of claim 1, further comprising:
    forming a first spacer over a first portion of the active area adjacent the first raised portion and forming a second spacer over a second portion of the active area adjacent the second raised portion;
    implanting nitrogen into the active area such that a level of nitrogen in the first and second portions of the active area is less than a level of nitrogen in a remaining portion of the active area; and
    removing the first spacer and the second spacer.

13. The method of claim 12, wherein the first raised portion and the second raised portion comprise shallow trench isolation regions, wherein the first spacer and the second spacer comprise nitride spacers, wherein the gate oxide is formed after removing the first spacer and the second spacer.

14. The method of claim 1, wherein the gate oxide has a non uniform thickness across the active area.

15. The method of claim 1, wherein the gate oxide is thicker in a region equidistant to the first raised portion and the second raised portion than in a region adjacent to the first raised portion and the second raised portion.

16. The method of claim 1, wherein the gate oxide is thicker over the first shaded area and the second shaded area than other areas of the active area.

17. The method of claim 1, further comprising forming a gate electrode after forming the gate oxide.

18. The method of claim 9, wherein the first raised portion and the second raised portion comprise shallow trench isolation regions having an exposed surface extending above the surface of the active area.

19. The method of claim 18, wherein the first angle is a positive angle with respect to a first axis perpendicular to a plane formed by a surface of the semiconductor body and wherein the second angle is a negative angle with respect to the first axis.

20. The method of claim 18, wherein the first angle and the second angle are substantially equal in opposing directions.

21. The method of claim 18, wherein forming the gate oxide comprises oxidizing the semiconductor body.

22. The method of claim 21, wherein the step of oxidizing is performed by a thermal oxidation process.

23. The method of claim 22, wherein the step of oxidizing is performed in an oxygen environment at a temperature of about 800° C.

24. The method of claim 18, wherein the first ion implantation implants nitrogen ions.

25. The method of claim 24, wherein the second ion implantation implants nitrogen ions.

26. A method of making a semiconductor device, the method comprising:
    forming an active area disposed in a semiconductor body between a first raised portion and a second raised portion;
    implanting into the active area, wherein the implantation implants substantially less ions than other areas of the active area in a first shaded area and a second shaded area, and wherein the first shaded area is disposed adjacent to the first raised portion, and the second shaded area is disposed adjacent to the second raised portion; and
    after implanting, forming a gate oxide over the entire active area, wherein the gate oxide is thicker over the first shaded area and the second shaded area than other areas of the active area.

27. The method of claim 26, wherein implanting comprises:
    performing a first ion implantation at a first angle in the active area, wherein the first ion implantation implants substantially less ions in the first shaded area than other areas of the active area; and
    performing a second ion implantation at a second angle in the active area, wherein the second ion implantation implants substantially less ions in the second shaded area than other areas of the active area.

28. The method of claim 26, further comprises forming a first spacer over the first shaded area and forming a second spacer over the second shaded area.

29. The method of claim 26, wherein implanting comprises implanting nitrogen ions.

* * * * *